United States Patent [19]
Theroux et al.

[11] Patent Number: 5,381,304
[45] Date of Patent: Jan. 10, 1995

[54] REWORKABLE ENCAPSULATED ELECTRONIC ASSEMBLY AND METHOD OF MAKING SAME

[75] Inventors: Gil Theroux, Phoenix, Ariz.; Allen G. Baca, Las Cruces, N. Mex.; Charles H. Hamp, III, Seattle, Wash.

[73] Assignee: Honeywell Inc., Minneapolis, Minn.

[21] Appl. No.: 75,972

[22] Filed: Jun. 11, 1993

[51] Int. Cl.$^6$ ............................................. H05K 7/20
[52] U.S. Cl. ..................... 361/706; 29/402.08; 174/52.2; 264/300; 361/713; 361/736
[58] Field of Search ............... 174/52.2; 361/687, 688, 361/704–706, 707, 708, 713, 720, 736, 752; 324/158 F; 165/185, 80.3; 29/840, 841, 402.03, 402.06, 402.08; 257/687; 264/112, 277, 278, 300; 428/411.1, 413, 423.1, 480, 901, 913

[56] References Cited
U.S. PATENT DOCUMENTS

| | | | |
|---|---|---|---|
| 3,474,531 | 10/1964 | Slenker | 29/628 |
| 3,608,029 | 9/1971 | Hough | 264/112 |
| 4,118,861 | 10/1978 | Palimisano | 29/631 |
| 4,414,606 | 11/1983 | Anderson | 361/397 |
| 4,729,062 | 3/1988 | Anderson et al. | 361/399 |
| 4,902,368 | 2/1990 | Oldham | 156/306.9 |
| 4,933,744 | 6/1990 | Segawa et al. | 357/72 |
| 4,991,286 | 2/1991 | Russo | 29/840 |
| 5,057,348 | 10/1991 | Drain et al. | 428/76 |
| 5,075,821 | 12/1991 | McDonnal | 361/386 |
| 5,123,538 | 6/1992 | Groenewegen | 174/52.2 |
| 5,250,848 | 10/1993 | Christie | 257/778 |

FOREIGN PATENT DOCUMENTS 2952297 7/1981 Germany ........................ 174/52.2

Primary Examiner—Gerald P. Tolin
Attorney, Agent, or Firm—Ronald E. Champion; Craig J. Lervick; Arnold L. Albin

[57] ABSTRACT

An improved encapsulant and method of application for rework of a modular electronic assembly. A housing is provided with a structure that permits deformation with thermal expansion of the encapsulant and reduces stresses applied to the electronic components therewithin. The selected encapsulant provides mechanical stability from shock and vibration, thermal conductivity to the surroundings, and freedom from deterioration of electrical performance. Critically, the encapsulant is readily excised for repair and replacement of defective components, thus allowing rework and salvage of the assembly. A potting tool is adapted for selectively refilling the housing to replace the excised portions.

6 Claims, 3 Drawing Sheets

REWORKABLE ENCAPSULATED ELECTRONIC ASSEMBLY AND METHOD OF MAKING SAME

BACKGROUND OF THE INVENTION

1. Field of the Invention

The present invention relates to the packaging of electronic assemblies, and more particularly to a construction and method of encapsulating electronic circuits wherein the encapsulating medium is easily removable for reworking or repair of the electronic system.

2. Description of the Prior Art

It is desirable when sensitive electronic circuitry are exposed to an environment of shock and vibration to protect the electronic assembly from damage induced by excessive forces applied to the components. Further, in operation such assemblies generate heat, which must be dissipated. Accordingly, past practice has provided for encapsulating the electronic components to prevent failure due to the effects of mechanical shock and vibration, and further to enhance transfer of heat from the assembly to an external heat sink.

The prior art has utilized rigid epoxies and foamed polyurethanes as encapsulants, with varying degrees of success. When an assembly is encapsulated or potted with epoxy and cured to a rigid state, effective protection to shock and vibration is provided by limiting excessive motion of the circuit boards and electrical components. However, when an assembly is rigidly encapsulated, repairs and circuit modifications are extremely difficult to accomplish, making such repairs frequently uneconomical or permitting damage to the circuit board and components, and resulting consequently in a "throwaway" assembly. The rigid material creates a "brick" which cannot practically be reentered. This prohibits failure analysis and replacement of failed circuits. In addition, the rigid material may cause mechanical failures due to differences in thermal coefficients of expansion between the encapsulant and the circuit elements. High voltage power supplies are particularly sensitive to manufacturing variances, increased capacitances, higher operating losses, and the resultant higher temperatures. DC to DC converters obtain power from an input source and convert it into regulated output power at higher or lower voltages for delivery to a load. Typically, for energizing a cathode ray tube, a voltage of the order of 25 kv may be required. However, not all of the input power is converted to output power, since the supply is not 100% efficient, and some power is dissipated as heat within the converter. Thus, the encapsulant must not hinder heat transfer, and preferably will enhance heat removal from the heat generating components into the surrounding environment. In one program, it was estimated that the cost of scrapping rigidly potted power supplies as opposed to accomplishing repair amount to upwards of $500,000.00 per year.

Another approach has been to encapsulate sensitive assemblies in a substantially rigid, shock absorbing polyurethane foam, which is accomplished by placing the reactive chemicals into an enclosure with the electronic assembly, which reacts to form a foam that fills the spaces between individual components and between the components and the housing. However, the foam has been found to act as an adhesive which bonds the components tightly into the assembly, thus making removal of components for repair very difficult and time consuming.

Liquid insulating fillers, such as oils and fluorinated fluids have been use, but require seals and bellows or other techniques to allow for liquid expansion and may penetrate and adversely affect component performance. Introducing an inert gas or evacuating the assembly housing requires hermetic seals, rigid mechanical component support provisions, and sophisticated means for heat dissipation. It has been found in testing that a ferrite core transformer, rigidly potted as a module, failed when encapsulated in silicone gel or RTV media. While said transformer functioned satisfactorily when encapsulated in a rigid medium, when encapsulated in the gel or RTV the transformer failed due to internal heating, which caused expansion of the transformer and fracture of the module potting. This was attributed to lack of physical support by the compliant media. The problem was exacerbated by poor thermal conductivity of the silicone gel. It was therefore found necessary to increase the thickness of the rigid module potting, which occupied additional space and added weight.

It is clear then that a need exists for an improved encapsulant and method of application which is effective in significantly reducing or eliminating the effects of vibration and shock on circuit components, while facilitating heat dissipation, and yet which may easily be removed from the components to permit them to be tested, serviced, modified, or otherwise processed with ease. A reworkable encapsulant in place of the above described encapsulating media will reduce costs by allowing modules to be reworked instead of scrapped, and cost effective failure analysis would be possible in view of the ease of entry into the module without disturbing the circuit elements. Ease of rework promotes reliability improvements by permitting discovery of the failure modes. Finally, production would be enhanced because elaborate component protection schemes now required with rigid encapsulants would not be required.

SUMMARY OF THE INVENTION

The present invention provides for encapsulating an electronic assembly with an elastic medium that provides support against shock and vibration, while enhancing heat transfer to the surroundings and permitting efficient, economical removal of the encapsulant for rework. Refilling the assembly enclosure after inspection and repairs is facilitated by a tool that provides for selectively applying the encapsulant to the circuit components while constraining the housing against overfilling.

A preferred embodiment of the invention comprises a generally rectangular housing open at its top and bottom boundaries, having a flexible wall defining arcuate interior corners, for accommodating deflection induced by thermal expansion of an encapsulating medium disposed therein. A removable planar top cover is secured to a top surface of the housing, and a removable planar bottom cover is secured to a bottom surface of the housing. A circuit board supporting a plurality of electronic components mounted thereupon is resiliently disposed within the housing. The encapsulating medium is preferably thermally conductive and has a predetermined thermal coefficient of expansion compatible with that of the electronic components and the flexible wall of the housing, so that expansion of the medium with increased temperature results in only temporary minimal deflection of the wall, while return to ambient temperature results in the wall resuming its original configuration, the medium substantially filling the space defined by the housing and surrounding the circuit board, while the circuit board is relatively resiliently constrained with respect to the housing with expansion and contraction of the medium, so that stress applied to the electronic components is minimized.

The encapsulating medium is a silicone elastomer having a density when cured for resiliently securing the circuit board and electronic components from shock and vibration, while its thermally conductive properties allow dissipation of heat generated by the components through the medium to the housing, the medium further having a density allowing removal with a razor-edged cutting tool so as to permit exposing the electronic components for test and repair.

DESCRIPTION OF THE PREFERRED EMBODIMENTS

Figure 1:
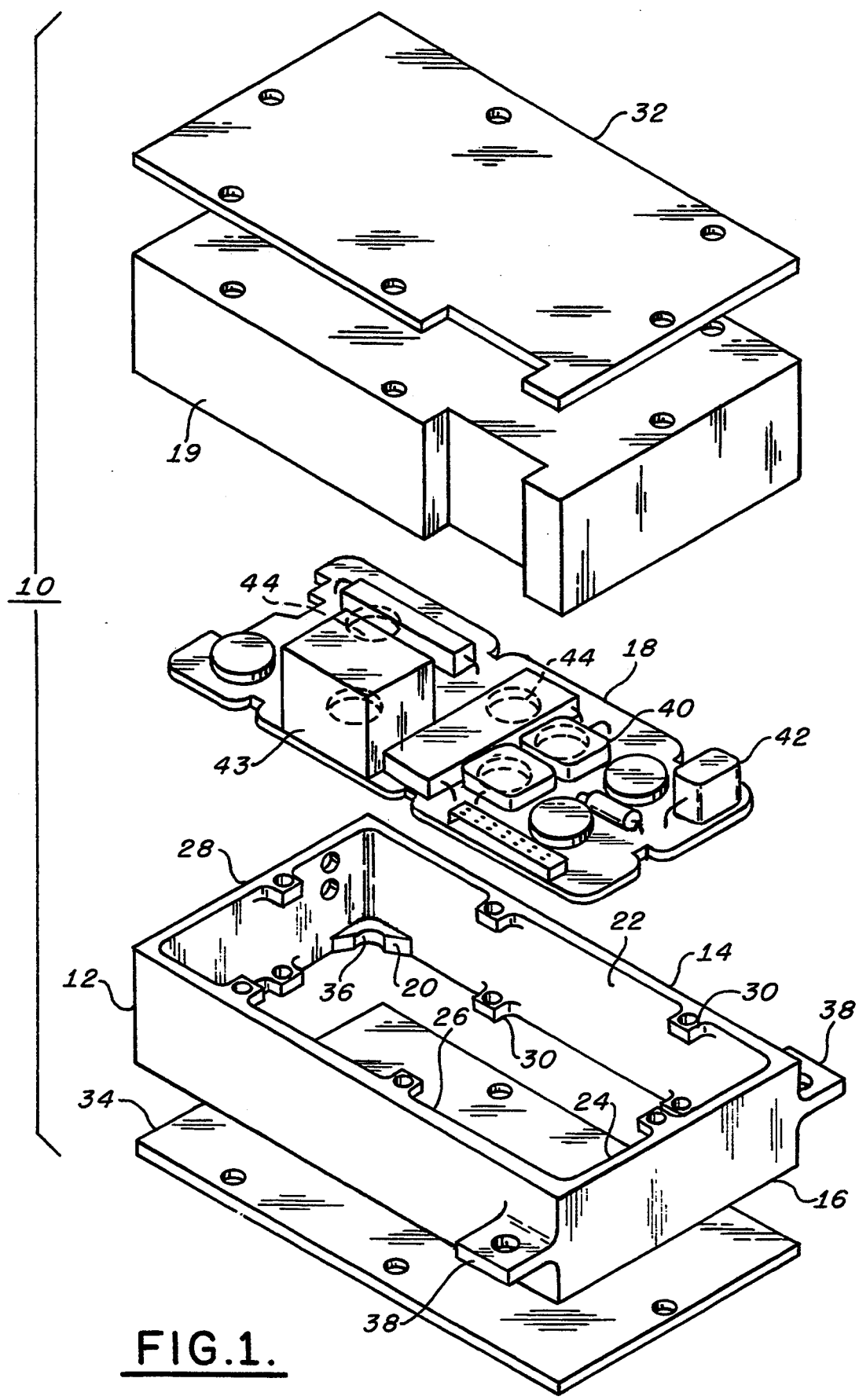
FIG. 1 is a conceptual exploded view of a reworkable encapsulated electronic assembly of the present invention, with the encapsulant removed to show a printed circuit board mounted therein.

A preferred embodiment is shown in the drawings, wherein like reference numerals designate like or corresponding elements. Referring now to FIG. 1 of the drawings, an electronic assembly 10 is depicted in an exploded view. As shown, the assembly includes a substantially rectangular housing 12 defining planar top and bottom faces 14 and 16, respectively. The housing 12 is comprised preferably of aluminum, and may be machined from a solid block or fabricated from sheet metal pieces welded together. The housing has a wall thickness of approximately 0.050 inch.

Disposed within housing 12 is a conventional double sided printed circuit board 18 which is generally rectangular in configuration, and is supported within housing 12 by a plurality of flanges 20 substantially symmetrically disposed along the walls 22, 24, 26, 28 and proximal to bottom face 16. Housing 12 is also provided with a plurality of tapped flanges 30 for securing top and bottom plates 32, 34. The top and bottom plates are substantially rectangular and planar, conforming to the peripheral contours of housing 12. Housing 12 is further fabricated with arcuate corners 36, which impart structural rigidity while allowing deflection of walls 22, 24, 26, 28 in accordance with temperature variations of the assembly in operation. Housing 12 is further provided with a plurality of mounting flanges 38 for securing the assembly in its intended environment.

Printed circuit board 18 may be a conventional double-sided glass epoxy circuit board which has copper conductive traces formed top and bottom (not shown in FIG. 1). Note that board 18 is shown in exploded disposition relative to housing 12 and normally rests upon and is supported within housing 12 by the flanges 20, where it will be resiliently confined by the encapsulating medium 19. This allows board 18 to accommodate expansion and contraction of the encapsulant and housing 12 without distortion or cracking of the traces, and without imposing stress on the electronic components mounted thereupon.

Positioned on board 18 are a variety of electronic components. The electronic components can assume a wide variety of different configurations, depending upon the type and size of individual components which are required in the electronic circuitry of the PC board subassembly. That is, small or large discrete components, such as capacitors, transistors, and transformers may be used, or the components may be circuit cards or microelectronic circuits. In a typical approach, shown in FIG. 1 (not to scale), a high voltage capacitor divider may be represented by a plurality of capacitors 40 measuring 0.6 in×0.6 in or by a capacitor stack 42 measuring 0.75×1.10 in, and a ferrite core transformer by dimensions 1.43 ×1.24×0.990 in. Semiconductors are typically 0.10 diam×0.5 in for diodes and 0.20 diam×0.15 in for transistors, while resistors range from 0.60 diam×0.30 in for low wattage types to 0.20 diam×2.2 in for high voltage types.

In order to facilitate rework, the PC board 18 is provided with strategically placed holes 44 or "pushouts" under selected components to allow later removal without the necessity of removing the PC board in its entirety, and to reduce encapsulant voids during the potting process.

As discussed above, the problem solved by the present invention is how to select and apply an encapsulant to an electronic assembly in a manner that provides protection against temperature extremes, humidity, dust, shock and vibration, and affords a substantial degree of thermal conductivity without causing structural impairment or degradation of electrical performance, and of a nature that permits selective removal of portions of the encapsulant and ready rework of the assembly components. The problem is essentially threefold: firstly, encapsulants as a class have different thermal coefficients of expansion than most electrical components, rendering them unsuitable for use in close contact with these electrical components. Secondly, while rigid encapsulants offer suitable properties with respect to mechanically securing the electronic components with minimal effect on performance, they render a defective assembly unsalvageable, as it cannot practicably be reworked. Thirdly, the encapsulant must have sufficient electrical inertness that the electrical performance of the assembly is not degraded, even when exposed to high potential, high frequency applications.

In selecting the material used to form the reworkable encapsulant, careful consideration must be given to the physical, chemical and electrical properties if it is to be successful as an encapsulant which retains its properties without damage to the electronic assembly over a wide range of operating conditions. The encapsulant material must be chemically inert and must not decompose or initiate corrosion. It should have a reasonable long shelf life. It must be insensitive to wide temperature ranges and maintain its properties at both high and low temperatures. It must be a good vibration damper and must be able to minimize the motion of components over a wide frequency and amplitude range. The compound should be electrically inert and must not affect or influence circuit operation. This requires a high dielectric strength, low dielectric constant, high insulation breakdown voltage, high resistivity, and a low dissipation factor.

A material survey was undertaken to identify suitable candidates for the encapsulant, with typical circuit components applied to a conventional two-sided printed wiring board. From approximately 60 materials that were believed to meet the criteria, the best 12 materials were chosen for testing. These tests were initially directed to quantify critical electrical parameters required for high voltage applications, as follows:

a. dielectric withstanding voltage of the bulk material.
 b. dielectric withstanding voltage at the material and substrate interface.
 c. insulation resistance at the material and substrate interface.

Power supplies operating at 25 kv demand materials with high dielectric strength. Improved dielectric strength allows sufficient derating for reliability and still permits compact, advanced packaging. Dielectric strength was tested in a bulk condition (through the potting material) and in an interfacial condition (at the interface of the encapsulant and the printed circuit board). The key mechanical tests included the following:

a. definition of absolute shear strength.
 b. observation of adhesion failure mode.
 c. determination of 25 percent minimum elongation.

Each of these tests was run on control samples and for samples subjected to the environmental screening. Results from these tests and from a computer modelling evaluation were used to select the four most favorable candidates. These encapsulants were in the family of silicone elastomers, both filled and unfilled. A rigid epoxy and flexible epoxy were also tested, as well as a urethane compound. The epoxy was rated unacceptable due to insufficient elongation, even though it provided the best adhesive strength. A minimum elongation of 25 percent is necessary to allow for differences in thermal coefficient of expansion between the encapsulant and the electrical components. A cohesive failure mode (separation of the encapsulant) shows balance between the material strength and adhesion and suggest that processing and substrate preparation are sufficient. Adhesive failure, i.e., failure at the material and substrate interface, is undesirable, even if under high stress conditions. Such failure suggests that the material movement predicted by the computer model cannot take place without loss of adhesion and damage to the components. A combination of sufficient adhesive strength to transfer stress to the material rather than the bond and good elongation is most desirable.

Shear testing was performed on a control sample and after thermal cycling. Electrical tests were performed on control samples, after thermal cycling, a rework procedure, and humidity testing. All test were performed after a variety of realistic environmental stresses. Performance was remeasured after rework was initiated. A repeat of acceptable performance indicates that supplies are truly reworked to original performance levels. Finally, the ability of a material to be reworked was judged using an objective qualitative ranking system. The soft silicone gel was found to be unmanageable and along with the urethane, which was found to be too tough to rework, were eliminated after this performance rating. The flexible epoxy was highly moisture absorbent and also eliminated.

Practice has shown that potting with a rigid material in a rigid container may permit thermal stresses as high as 13,000 psi with resultant component damage. Silicone materials do not create such high degrees of stress, and with suitable component selection and lead strain relief will not create stress problems. However, silicone encapsulants inherently have a high thermal coefficient of expansion. During thermal cycling of sample packaged electronic assemblies failure was experienced of cracking of high voltage transformers due to the thin exterior wall construction of the transformer. Cracking was especially prominent in unfilled silicones due to their reduced heat dissipation capability. It was determined that soft silicone does not provide sufficient back pressure to accommodate the thermal expansion of the encapsulant. Therefore, a thicker transformer wall was required. Further relief from expansion stress was obtained by constructing the housing of thin wall material, to allow flexing when stressed, thus relieving the stress on the components, while forming the corners of the housing in arcuate fashion to retain structural integrity of the case.

Figure 2:
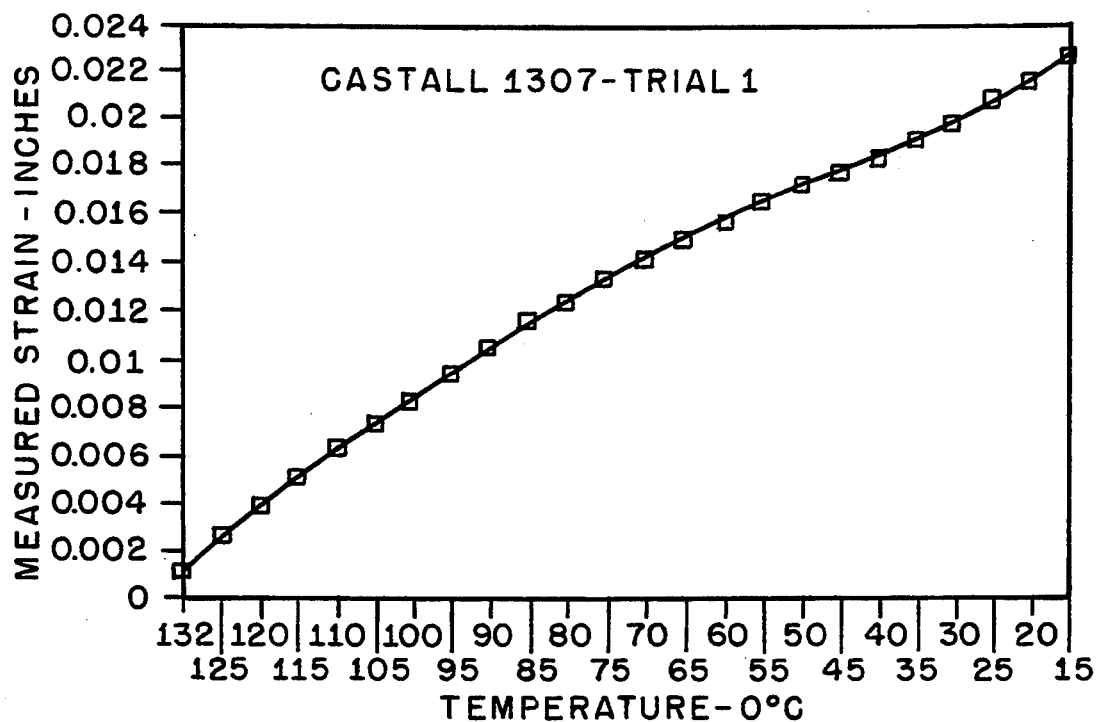
FIGS. 2 and 3 are graphs of component displacement due to expansion of the encapsulant as a function of temperature.
Figure 3:
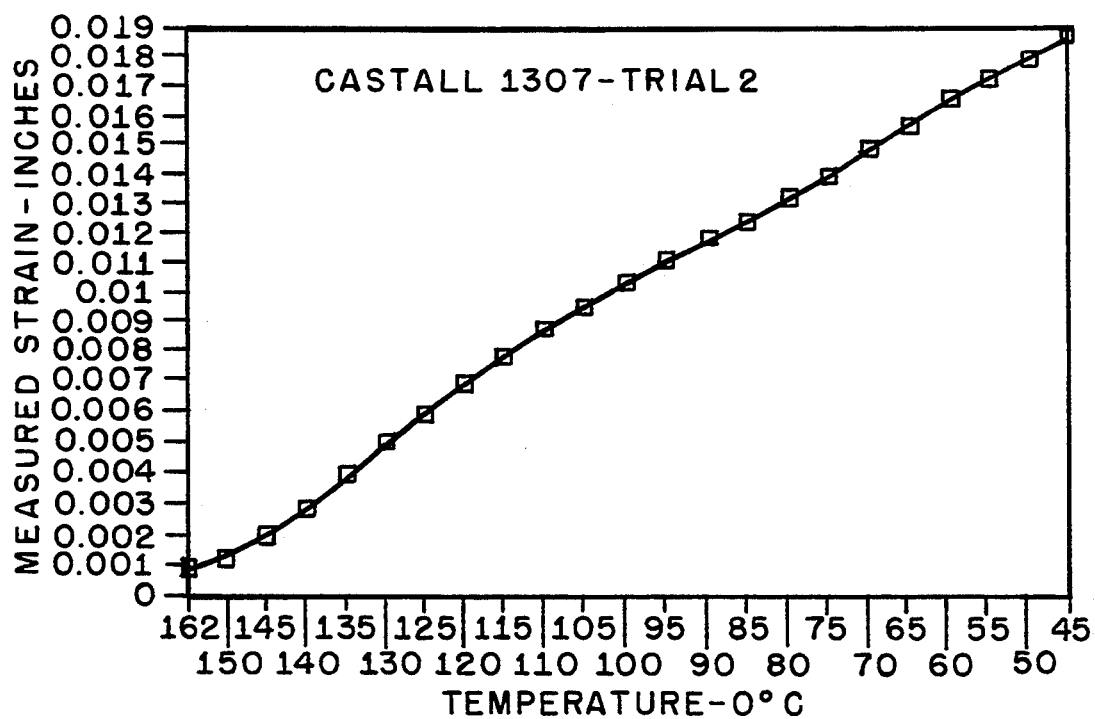

FIGS. 2 and 3 show experimental plots of component deflection versus temperature for the selected encapsulant.

A commercially available product that has been found to possess the aforementioned essential properties is CASTALL S-1307, manufactured by Castall, Inc. of East Weymouth, Mass. It is a primerless, high molecular weight, heat curable silicone resin composition convertible when cured to an elastomer. It is compounded from a two-part system, part A comprised of a polydimethylsiloxane resin and part B comprised of a polymethylhydrogensiloxane catalyst mixed in a ratio of 1:1 by weight. Among the significant properties are good thermal conductivity (0.0034 cal/s/cm$^2$/° C./cm), low temperature coefficient of expansion (137 ppm/° C.) and relative firmness (75 Shore A).

Figure 4:
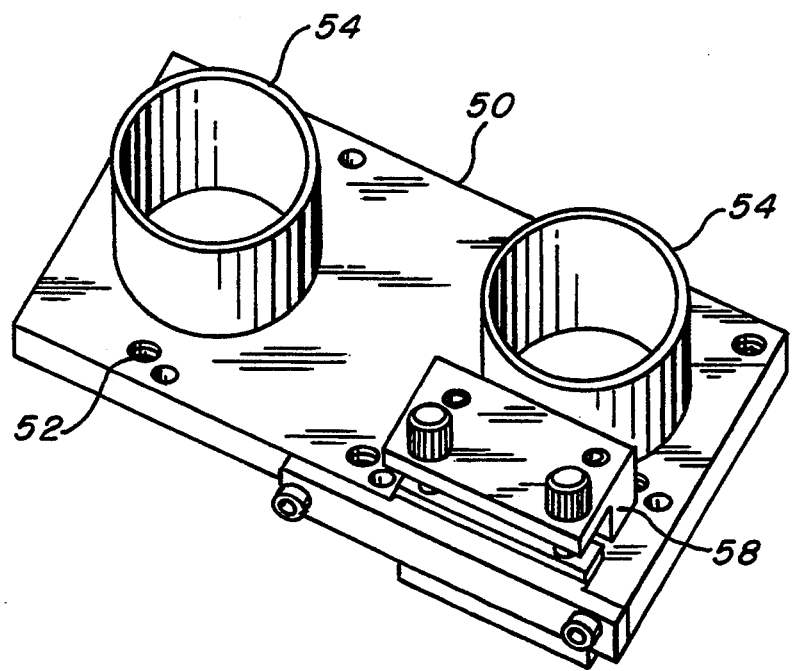
FIG. 4 is a perspective view of a potting tool used for selectively applying encapsulant to a reworked electronic assembly.
Figure 5:
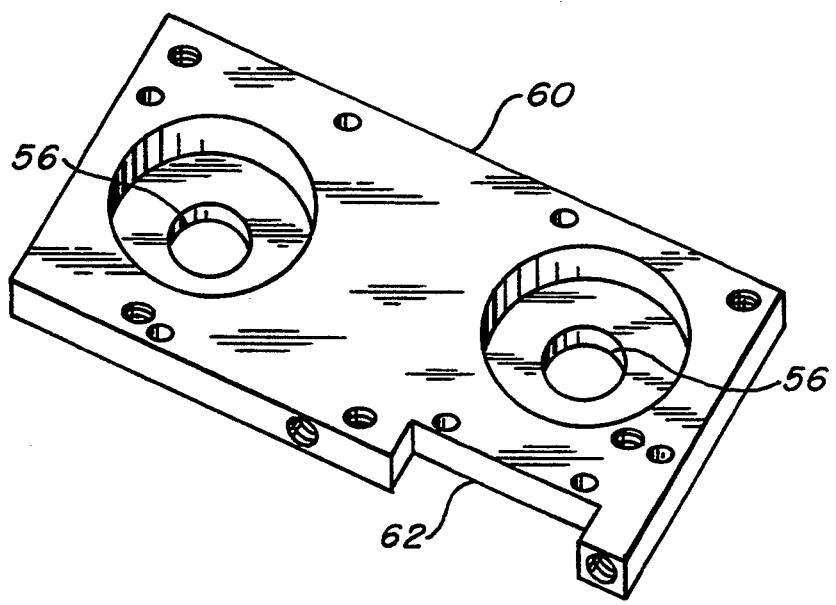
FIG. 5 is a perspective view showing the structure of the potting tool with a portion of the tool removed for clarity.

Turning now to FIGS. 4 and 5 of the drawings, there is shown a potting tool 50 to facilitate selective filling of the housing after portions of the encapsulant have been removed, as by a razor-edged tool. Tool 50 is provided with a plurality of holes 52 for mounting to corresponding tapped flanges 30 of housing 12, and a plurality of cylindrical collars 54 mounted over resin influx openings which are disposed over selected component areas of the printed circuit board 18. Tool 50 is provided with a clamp assembly 58 which engages a connector on the circuit board (not shown), thereby to assist alignment and preclude inflow of encapsulant into the connector area. The baseplate 60 is accordingly provided with a slot 62 for accepting the clamp 58.

For rework, the top and bottom covers are removed, and a portion of the encapsulant over a suspect component area is excised with a razor-edged tool, such as the commonly found Xacto ® knife. Tests are performed on the circuit board test points, as required to identify the failed component, which is then replaced by procedures well known to those skilled in the art, utilizing the pushouts as necessary for access, and the assembly is retested for proper operation. The potting tool 50 is then secured to housing 12 in place of the top cover and the bottom cover secured to the housing. The encapsulant is then compounded and applied through selected ones of the cylindrical openings 54. Since the openings are in fluid communication with and the potting compound is chemically and physically compatible with the silicone elastomer within the housing 12, the excised portion of encapsulant is readily and efficiently refilled. The module with potting tool is then evacuated. After completion of the vacuum pour cycle the module is placed in an oven to be cured preferably for at least 16 hours at an elevated temperature of 85° C. The potting tool is then removed, the pour spouts cut off, and the top cover secured to the module. Since an elevated temperature is required for cure, no interference between the top cover and the encapsulant will be encountered, since the encapsulant contracts as it cools down. While the tool 50 has been adapted for application to the top surface of circuit board 18 which bears an electrical connector, a similar structure may be used for accomplishing refill access through the bottom of housing 12. However, in practice, it is usually necessary to access both top and bottom of the module, so that refill from the top is generally all that is required.

While the invention has been described in its preferred embodiment, it is to be understood that the words which have been used are words of description rather than of limitation and that changes within the purview of the amended claims may be made without departing from the true scope and spirit of the invention in its broader aspects.

We claim:

1. A reworkable encapsulated electronics assembly, comprising:
    a generally rectangular housing open at its top and bottom surfaces, having a flexible wall for accommodating deflection induced by thermal expansion of an encapsulating medium disposed therein, said wall further defining arcuate interior corners,
    a removable planar top cover secured to said top surface of said housing,
    a removable planar bottom cover secured to said bottom surface of said housing,
    a circuit board resiliently disposed within said housing and supporting a plurality of electronic components mounted thereupon,
    said encapsulating medium being thermally conductive, having a predetermined thermal coefficient of expansion compatible with that of said electronic components and said flexible wall, so that expansion of said medium with increased temperature results in temporary deflection of said wall, and contraction of said medium with return to ambient temperature results in said wall resuming an unflexed configuration, said medium substantially filling the space defined by said housing and surrounding said circuit board, whereat said circuit board is relatively resiliently constrained with respect to said housing with expansion and contraction of said medium, so that stress applied to said electronic components is minimized, said medium having a density when cured for resiliently securing said electronic components from shock and vibration, while allowing dissipation of heat generated by said components through said medium to said housing, said medium further having a density allowing removal with a razor-edged cutting tool so as to permit exposing said electronic components for test and repair.

2. An assembly as set forth in claim 1, wherein said encapsulating medium comprises a high molecular weight heat curable silicone resin composition convertible when cured to an elastomer.

3. An assembly as set forth in claim 2, wherein said encapsulating medium is comprised of a two-part composition, said two-parts comprised respectively of a polydimethylsiloxane resin and a polymethylhydrogensiloxane catalyst mixed in a ratio of 1:1 by weight.

4. An assembly as set forth in claim 1, wherein said housing is comprised of aluminum having a wall thickness generally of 0.05 inches.

5. An assembly as set forth in claim 1, wherein said printed circuit board is provided with a plurality of apertures underlying said electronic components, for minimizing potting voids and for facilitating component access when reworked.

6. A method for repairing and selectively filling with a silicone elastomer encapsulant a generally rectangular housing for an electronic circuit assembly, said housing being provided with removable top and bottom covers, comprising:
    removing at least one of said top or bottom covers,
    excising a portion of said silicone encapsulant within said housing to expose a desired portion of said circuit assembly,
    testing and removing for repair or replacement a given component of said circuit assembly,
    installing said repaired or replaced component, and testing said assembly for proper operation,
    applying a potting tool having a plurality of cylindrical resin influx openings including at least one opening oppositely and substantially superimposed over said circuit board, said potting tool being provided with mounting means for securing to said housing in place of said removed top or bottom cover,
    filling said at least one opening with a high molecular weight heat curable silicone resin, said resin being in fluid communication with and compatible with said silicone encapsulant, so that a region of said encapsulant corresponding to said excised portion is refilled with said resin,
    curing said resin in a vacuum at a predetermined temperature for a predetermined time,
    removing said potting tool and cutting away any portion of said refilled encapsulant emerging from the surface of said housing, and
    securing said at least one of said top or bottom covers to said housing.

* * * * *